United States Patent [19]
Schmid

[11] Patent Number: 5,326,442
[45] Date of Patent: Jul. 5, 1994

[54] APPARATUS FOR THE GALVANIC TREATMENT OF ARTICLES

[75] Inventor: Dieter C. Schmid, Freudenstadt, Fed. Rep. of Germany

[73] Assignee: Gebr. Schmid GmbH & Co., Freudenstadt, Fed. Rep. of Germany

[21] Appl. No.: 26,488

[22] Filed: Mar. 4, 1993

[30] Foreign Application Priority Data

Mar. 14, 1992 [DE] Fed. Rep. of Germany ....... 4208206
Apr. 15, 1992 [DE] Fed. Rep. of Germany ....... 4212567

[51] Int. Cl.$^5$ .............................................. C25D 17/28
[52] U.S. Cl. .................................................... 204/198
[58] Field of Search ......................................... 204/198

[56] References Cited

U.S. PATENT DOCUMENTS

| 3,970,540 | 7/1976 | McBain | 204/297 W |
|---|---|---|---|
| 4,755,271 | 7/1988 | Hosten | 204/198 |
| 4,776,939 | 10/1988 | Blasing et al. | 204/198 |
| 4,898,657 | 2/1990 | Hosten | 204/198 |
| 4,948,486 | 8/1990 | Hosten | 204/198 |

FOREIGN PATENT DOCUMENTS 362512 4/1990 European Pat. Off. .
3236545 5/1983 Fed. Rep. of Germany .
2845886 11/1987 Fed. Rep. of Germany .

OTHER PUBLICATIONS

*Soviet Inventions Illustrated*, Section Ch:Chemical, Week A39, Issued Nov. 8, 1978, Derwent Publications Ltd., pp. 8-9, Summary SU-579-351.

*Primary Examiner*—Donald R. Valentine
*Attorney, Agent, or Firm*—Barry R. Lipsitz

[57] ABSTRACT

An electroplating apparatus (11) has a conveying system (19), which passes the printed circuit boards on a horizontal passage path through the treatment chamber (13). They are contacted by tong-like grippers (32), which run upstream of the leading edge (63) of the circuit board and in this area engage thereon from above and below. The gripers (32) are fixed to transverse beams (29), which are guided on both sides by chains (26) and electrically contacted by contact rails (39). Thus, the circuit boards (12) are moved in a horizontal, central path and simultaneously contacted. Alternatively the circuit boards (12) can be conveyed between electrically connected contact roll pairs (21), which are conveyed by an upper and lower conveyor (20a, b) and automatically rotate in order to convey the circuit boards at high speed.

39 Claims, 6 Drawing Sheets

APPARATUS FOR THE GALVANIC TREATMENT OF ARTICLES

FIELD OF THE INVENTION

The invention relates to a galvanic or electroplating apparatus for printed circuit boards and similar articles passing on a substantially horizontal passage path through a treatment chamber.

BACKGROUND OF THE INVENTION

U.S. Pat. No. 4,755,271 and U.S. Pat. No. 4,776,939 disclose electroplating apparatuses, in which printed circuit boards are passed horizontally through a treatment chamber. At the edge of the treatment chamber and optionally separated by a shield, are provided conveyors, such as chain conveyors, which grip the circuit boards in tong-like manner from the side and in this way guide them through the treatment chamber. In the latter copper is electrolytically applied, the power supply being provided via the tongs. When using tong guides on both sides only one circuit board width can be treated.

DE-32 36 545 C2 discloses an apparatus, in which the lateral guidance of the circuit boards is provided by contact rolls positioned behind a shield. A sliding guide can be provided on the other circuit board side.

These arrangements only operate in a satisfactory manner with circuit boards of a uniform size. When using circuit boards which are narrower than the passage path, as a result of their one-sided guidance and contacting they pass asymmetrically through the treatment chamber. As the treatment liquid, i.e. the electrolyte is vigorously moved, they are then unreliably guided or the guides on the free side must be separately adjusted for each circuit board width. Therefore it is not possible to treat several circuit board sizes in alternating manner in the apparatus. In the case of electrolytic treatment the asymmetry also requires a partial covering of the anodes, because otherwise the electroplating application is non-uniform over the width.

OBJECTS OF THE INVENTION

Objects of the invention are to avoid these disadvantages and in particular to provide an apparatus, which, without functional disadvantages and without significant changes can treat articles like circuit boards of varying size.

SUMMARY OF THE INVENTION

The apparatus according to the invention compromises conveying means for conveying the articles through a treatment medium, such as an electrolytic solution; and contacting means provided on the conveying means for electrical contacting and supply of electrical power to the articles, the contacting means provided to contact the articles at least in the vicinity of a central area of the passage path.

The contacting means, which can simultaneously also transport or convey the articles through the treatment chamber, consequently do not have to act laterally and can instead act distributed centrally or substantially centrally about the central axis. In an embodiment they can comprise several juxtaposed tong-like grippers arranged on a rod and supplied via the latter with current, so that the article, particularly a circuit board can be cathodically connected and so as to permit the passage thereof between anodically connected containers with copper balls or the like. The contacting means can run by means of chains, toothed belts, etc. on either side of the treatment chamber on a horizontal path through the latter. The grippers can be opened by a suitable mechanism, e.g. wedge-shaped tapering guide surfaces at the start and finish of the passage path. The articles are moved into the open tongs by means of another part of the conveying means, e.g. pairs of rollers. The endless or continuous conveyor carrying the contacting means and which is stopped or slowed down until the articles are introduced into the tongs, then travels loosely and the grippers close. At the end of the treatment chamber similar opening means again open the gripper mechanism and in front of the circuit board the grippers pass downwards and are then returned in the lower strand of the continuous conveyor, whilst the circuit board is discharged between the roller pairs.

It is therefore possible to treat circuit boards of random size without reequipping the apparatus and move them centrally past the anodes. This is advantageous in other treatment processes.

The roller pairs between which the articles gripped by the grippers are guided on the passage path have on their circumference recesses, which so cooperate by the synchronous drive of the rollers and the continuous conveyor that they pass through the rod-like transverse beam on which the grippers are arranged. Consequently the rollers have a roughly Maltese cross-like cross-section.

Contacting is very good as a result of the grippers, whereof several can act on an article. Apart from the contact faces the remaining parts of the mechanism can be made from non-conductive materials or enveloped with the latter. If as a result of the electroplating process material is applied to the contact faces, it can be galvanically removed again during the return travel, which also takes place in the treatment chamber and below the passage path. For this purpose the grippers can be kept open by correspondingly long opening means in the form of rails opened by the grippers.

As the chains and power supply means for the transverse beams, i.e. the contact rails should not travel in the treatment liquid, between them and the treatment chamber is provided a shield or seal. This can be formed by labyrinth packings, brushes, elastic sealing strips, etc. As there is freedom with respect to the shaping of the transverse beams, particularly at this point they can be so constructed that they provide the most favourable cooperation with the sealing means.

For the previously described decopperizing, it is admittedly advantageous if the return strand of the continuous conveyor passes in the treatment chamber below the treatment path. It can e.g. simplify the seal if the return strand is constructed as the upper strand, i.e. passing above the container and therefore the liquid level.

In order to conveyor the circuit boards on the advantageously horizontal passage plane and allow them to enter the grippers and then be freed therefrom, a control is provided, which as a result of differences in the speed between the contacting means, i.e. the continuous conveyor on which the grippers are located and the supply and removal means, i.e. the conveying portions, which introduce and remove again the articles, it is possible to have a bringing together or separation of the articles with respect to the grippers. This can take place in that the continuous conveyor with an opened gripper series is stopped in the introduction position and only starts up again when an article, i.e. a circuit board has entered the gripper and finally in the discharge area and following gripper opening the gripper can move away upstream of the circuit board to be discharged. However, it is also possible in the case of a constantly traversing continuous conveyor, (which would be advantageous for electroplating) by planned acceleration or deceleration of the circuit boards in the entry or exit area to ensure that the articles reach the contacting means precisely at the time when they close. Upstream of the discharge operation can be provided drive means, e.g. roller sets, which are drivable independently or only to a limited extent dependently on the continuous conveyor and which briefly hold back the circuit board, so that it is freed from the gripper and then conveyed on towards the discharge point a short distance behind the gripper. This can e.g. be brought about by an electric drive means controllable electronically by sensors for the articles, e.g. for their leading edge, or also by mechanical means such as nonuniformity or cam mechanisms.

In a particularly preferred embodiment of the invention the contacting means can be constructed for conveying the articles at a higher speed than that of the contacting means, so that both the article and also the contacting means are movable and the latter can be supplied to a random, galvanically etching or other decopperizing process.

The contacting means can be contact rolls, which are moved by the conveying means along the passage path. They can engage over the central area of the articles and be positioned above and below the passage path. If they are driven in conveying manner in the passage direction and are preferably synchronized in opposition, then they convey the circuit boards between them at the same speed as that at which they are driven, so that the circuit boards then have twice the conveying speed of the contact rolls.

The contact rolls can in turn be fitted to the upper and lower chain or belt conveyors and contacted by means of contact rails. The contact rails can bring about the rotary drive in conjunction with contact wheels, which are in turn provided on the contact roll spindles.

The contact rolls, which can have alternating conductive and insulating areas, can contact the circuit board faces in large-surface manner and also over a considerable width, so that the conduction of the not inconsiderable electroplating currents through the partly very thin, conductive coatings causes no problem. They can be relatively closely juxtaposed and therefore can contact a large circuit board several times in the area of its length. In particular they form an ideal guide for the articles, which consequently involves providing no further guiding aids.

These and further features can be gathered from the claims, description and drawings and the individual features, both singly and in the form of sub-combinations, can be realized in an embodiment of the invention and in other fields and can represent advantageous, independently protectable constructions for which protection is hereby claimed.

BRIEF FIGURE DESCRIPTION

Embodiments of the invention are described in greater detail hereinafter relative to the drawings, wherein show:

FIGS. 1a & b: Two associated portions of an electroplating apparatus in a diagrammatic longitudinal section.

FIG. 2: A plan view of a portion of the electroplating apparatus.

FIG. 3: A partial section along the line III.

FIG. 4: A diagrammatic representation of a variant.

FIG. 5: A diagrammatic longitudinal section through another preferred embodiment of an electroplating apparatus.

FIG. 6: A plan view of a portion of the electroplating apparatus according to FIG. 5.

FIG. 7: A section through a detail along line VII in FIG. 6.

FIG. 8: A part sectional view along the line VIII in FIG. 7.

DETAILED DESCRIPTION OF EMBODIMENTS

Figure 1A:
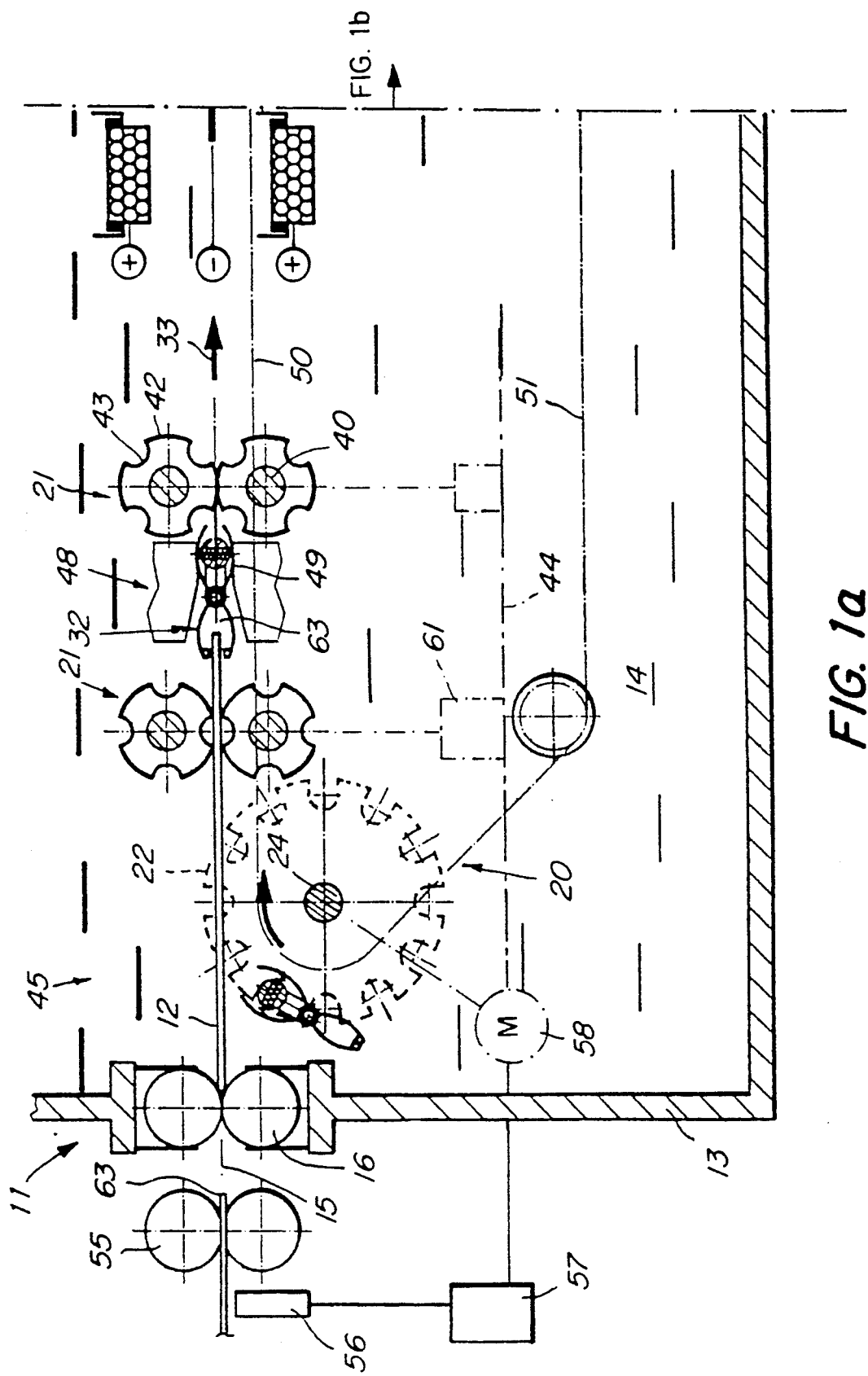
Figure 1B:
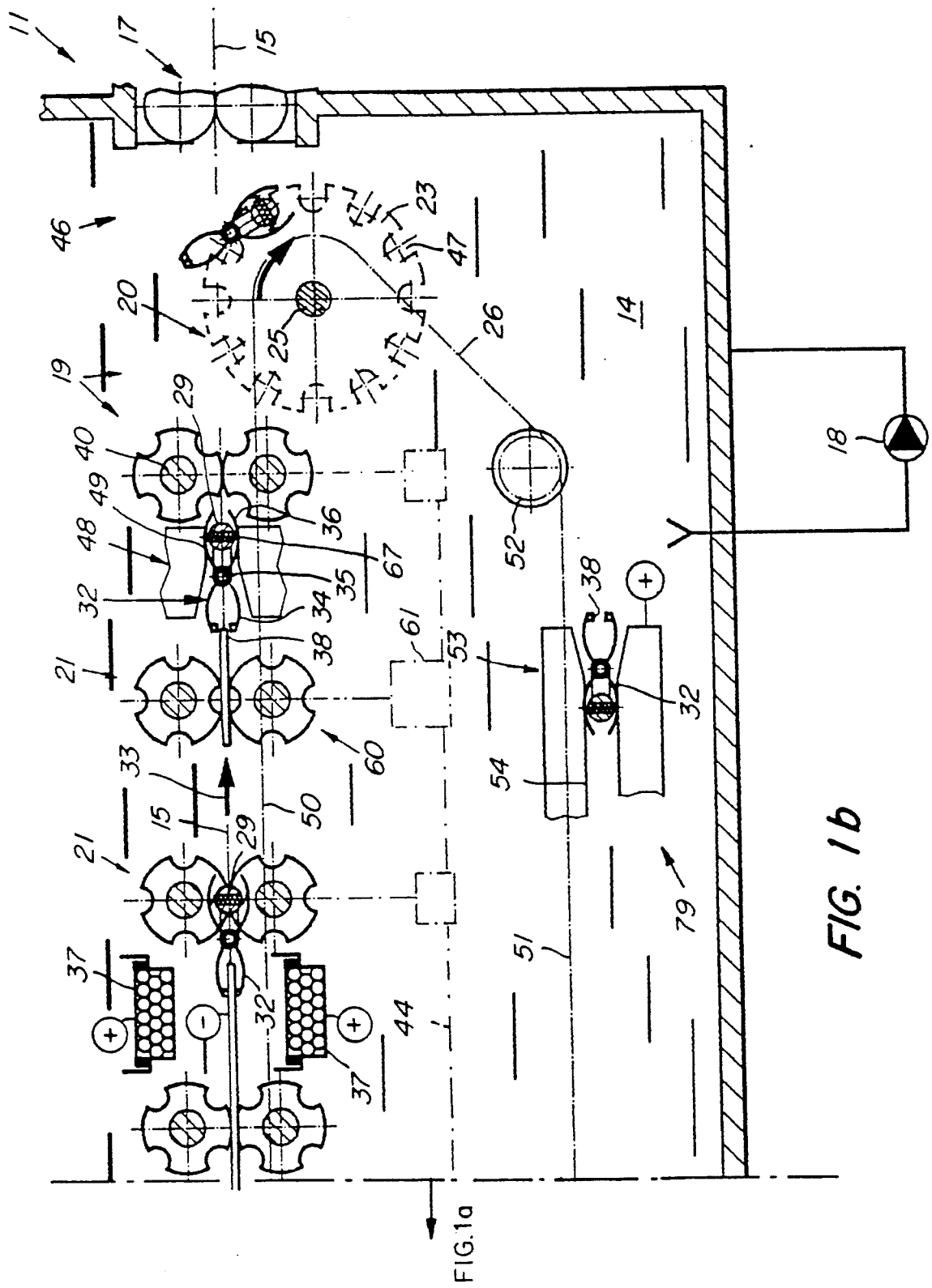

FIG. 1 shows an electroplating apparatus 11 for plate-like articles 12, such as printed circuit boards. It has an elongated treatment chamber 13 in the form of a container, which contains the treatment medium 14, i.e. an electrolytic solution.

The articles are guided through the treatment chamber on a passage path 15 located in a horizontal plane and are introduced and discharged by inlet and outlet locks 16, 17 in the form of sets of rollers. The treatment medium 14 is higher than the said locks. It is circulated by means of a diagrammatically indicated pump 18 and its density, state and temperature are monitored.

The printed circuit boards 12, which are shown in part shorter than they really are in the diagrammatic representation which is significantly shortened with respect to the apparatus length, are moved by conveying means 19 through the electroplating apparatus and which in the present embodiment comprise a continuous conveyor 20 and guidance means 21 in the form of cooperating roll or roller sets. The guide means and continuous conveyor are synchronously driven in a manner to be described hereinafter.

The continuous conveyor 20 is a chain conveyor with an inlet-side and an outlet-side chain wheel 22, 23 on each chamber side. They are mounted on shafts 24 and in each case drive a chain 26, which runs laterally outside the chamber wall 27.

On the chains are provided support members 28, to which are fitted transverse beams 29 in the form of in each case one rod. They project through slots 31 in the chamber wall 27, which are sealed by conventional packings 20 in labyrinth packing multichamber construction, brushes, elastic sealing strips, etc. and project through the entire treatment chamber. In uniformly spaced manner over the entire width of the treatment chamber are provided on the transverse beam 29 several, e.g. six contacting means 32 in the form of grippers or tongs, whose gripping arms 34 are directed counter to the passage direction (arrow 33). On the gripping arms 34 are provided actuating or operating arms which, guided in the centre of a horizontal spindle 35, cross one another there, so that the gripping arms open on compressing the operating arms 36 in the manner of combination tongs. A spring 67 normally keeps them resiliently closed.

All the parts located in the treatment chamber with the exception of anodes 37 in the form of baskets with copper pieces, which are located above and below the passage path 15 and the contact faces 38 of the gripping arms, all the parts within the treatment chamber are made from non-conductive materials such as plastics, or are coated therewith. The electrically conductive contact faces of the contacting means are conductively connected to the transverse beam 29 and the latter conducts power to them and is supplied in the embodiment by means of lateral contact rails 39 (FIGS. 2 and 3), which are positioned outside the chains 26. The power supply can also take place directly by means of the chains or the support members 28.

In a reciprocal spacing which is normally smaller than a circuit board length, are provided the roller sets forming the guidance means 21. They contain in each case roller portions 41 arranged on an upper and a lower drive shaft 40 and which in cross-section have a Maltese cross-like configuration. Their otherwise circular cylindrical jacket 42 has semicircular recesses 43, which is shape-adapted to the circular cross-section of the transverse beam 29 in the present embodiment. They are so synchronously driven with the continuous conveyor 20, that on the one hand their circumferential speed in the vicinity of the jacket 42 coincides with the conveying speed of the transverse beam 29 and on the other said transverse beam is surrounded by the recesses 43, so that they can pass through the roller pairs which are resiliently superimposed or only have a limited reciprocal spacing. For this purpose they are driven by a not shown synchronous drive located in the vicinity of the chamber wall 27, e.g. by means of chains, spur gear rows or a continuous synchronous shaft 44 (shown in FIG. 1) with bevel gears. The drive of the synchronous shaft is mechanically or electrically derived from that of the continuous conveyor. The chain wheels 22, 23 are constructed in such a way that the transverse beam is received in the correspondingly large tooth gaps 47.

Adjacent to the inlet area 45 and the outlet area 46 are provided opening means 48, which in each case comprise guide rails positioned above and below the passage path and which taper in funnel-shaped manner in the passage direction. Opening could also take place by direct actuation, e.g. by pneumatic cylinders. They cooperate with the operating arms 36 of the contacting means 32 and open the latter on entering. In a parallel portion 49 following on to the taper the gripper-like contacting means remain open.

The represented continuous conveyor 20 contains the passage path 15 for the articles 12 to be treated in the vicinity and namely somewhat above its upper chain strand 50, which runs between the inlet and outlet-side reversing wheels 22, 23. The return takes place by means of a parallel return strand 51 located below it and which runs between lower reversing wheels 52. In the vicinity of the lower strand 51 there are opening means 53, whose cylindrical portion 54 is much longer and can pass virtually over the entire length of the lower strand. In this area forming a device 79 for removing interfering coatings (decopperizing device), the transverse beams are also contacted by contact rails located outside the treatment chamber, but with a reverse polarity (anodic), so that the gripper contact faces 28 exposed through the opening of the contacting means now act as an anode and optionally any electroplating located thereon is anodically removed.

In the inlet area the circuit boards are supplied by roll pairs 55 located outside the treatment area. In this area is provided a sensor 56, which can e.g. respond to the leading edge 63 of the articles 12. It is connected to a control 57, which controls the drive of the continuous conveyor and/or individual roller pairs of the guide means 21 in the inlet and outlet area 45, 46.

The apparatus operates according to the following procedure. The articles 12 (circuit boards) are conveyed up to the inlet area by the introduction roll pairs 55, the leading edge thereof triggering the sensor 56. They are accelerated by the driven rollers to the entrance lock 16 and introduced into the treatment chamber, where they are gripped and guided from above by the first guide means 21, which are optionally provided with an overriding clutch. They are then introduced between the opened gripping arms of the contacting means on a transverse conveyor.

To this end the continuous conveyor can be briefly stopped on introducing a circuit board, controlled by the control 57 and namely precisely at the location where the contacting means (gripper 32) of the transverse beam are opened, because their operating arms 36 are in the vicinity of the parallel portions 49. The continuous conveyor 20 then starts up again, the gripping arms of the contacting means close and contacts the conductively prepared areas on the surface of the circuit board. By means of the transverse beam and the rails 39 the circuit board is cathodically contacted and is consequently drawn on the planar passage path 15 through the treatment chamber and therefore between the anodes. It is not only electrically contacted by the contacting means, but is also held and is also guided through the guide means 21 and conveyed forwards therewith. The electrically contacting grippers consequently travel in the same plane and movement path as the articles and in front of the latter.

During the passage through the electroplating area, i.e. between the anodes 37, the circuit boards pass over and beyond not shown wave nozzles, which force the treatment medium from below against the circuit boards and in particular through the relatively small bores into the latter, so as to also ensure completely satisfactory electroplating in the perforated area.

Figure 2:
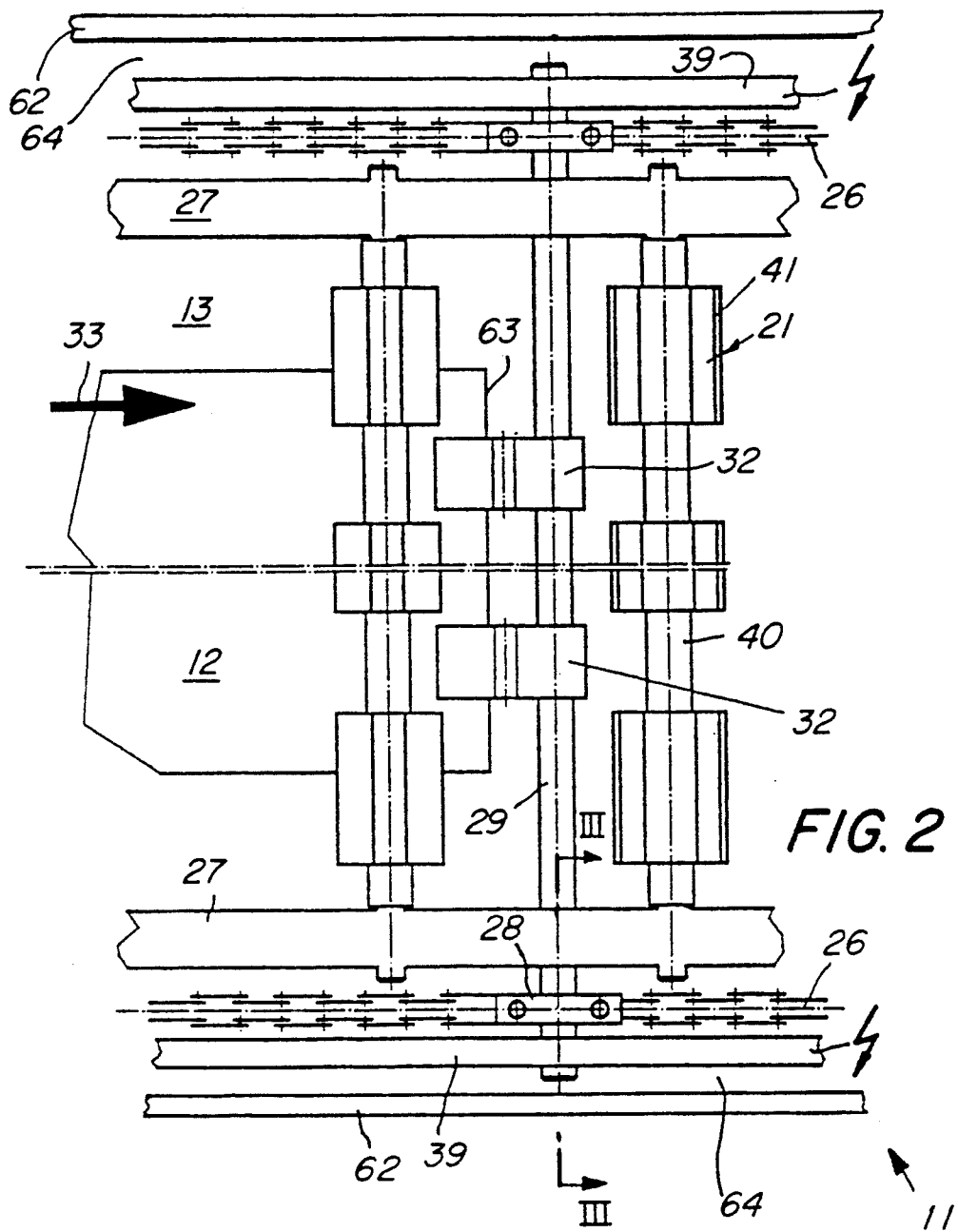
Figure 3:
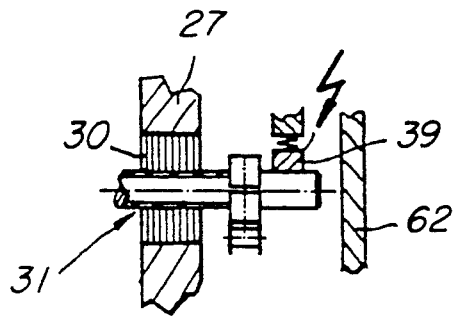

It can in particular be gathered from FIG. 2 that the circuit board can be guided on any random position of the path width, but is preferably centrally guided to the median plane of the treatment chamber, the width of the particular board being unimportant. It is also possible to supply different circuit board widths in random alternating form without having to leave this central orientation. If only certain of the contacting means provided over the treatment chamber width engage the circuit board, this is unimportant, because the remaining contact faces close under the spring tension and are consequently substantially protected against electroplating.

During conveying on the passage path as a result of the synchronization between the guide roller pairs 21 and the continuous conveyor, the transverse beams 29 pass in frictionless manner between the rollers. In the outlet area 46 the contacting means again pass into an opening means 48 and are opened. In this area the circuit board, e.g. by a brief, planned uncoupling of the guide roller pairs 60 upstream of the opening area or by a corresponding acceleration of the continuous conveyor, following the opening of the contacting means, can be drawn out of the gripping arms thereof. Further conveying can then take place at the same speed and, following the contacting means, the circuit board can be conveyed in the direction of the discharge lock 17 and out of the latter. For example, by means of a separate speed-change gear 61 and as a function of the control 57, the roll pair, in spacing-correct manner, can be stopped e.g. for a ¼ revolution, so that at the end of the stoppage it travels on with the previously described synchronism with the continuous conveyor. The same could take place with the reverse sign, i.e. with an accelerate forward travel of the first roller pair in the inlet area 35, so as to introduce the circuit board between the gripping arms.

After leaving the outlet-side opening means the tongs close again under spring tension and returns to the lower strand and are opened between the rails 54 for a longer time and anodically connected for decopperizing.

The treatment medium, i.e. the electroplating solution, is continuously circulated and is also returned from the "semidry" area 64 between the chamber wall 27 and an outer wall 62 (FIGS. 2 and 3), so that significance is not attached to complete sealing by the packings 30. The same applies for the leakage liquid passing out in the lock area.

Numerous variants of the above-described embodiment are possible. Thus, for example, the complete conveying system for the articles can take place as a function of the signal from an external sensor and the different conveying speeds by means of a control 57. However, it is also possible to use other signals for control purposes, e.g. signals initiated by the passage of the articles through individual roller pairs, etc.

The guide roller pairs 21 are so positioned that in the case of adjacent rollers in each case two circumferential portions are located in the circuit board-contacting area, if in the adjacent roller pair two recesses face one another. As one circuit board may, be simultaneously engaged by two roller pairs, this allows a reliable guidance. The roller pairs can also be kept in contact with different circuit board thicknesses in self-adapting manner through weight or spring tension. It is also possible, particularly in the inlet or outlet area, to make use of the point at which the two recesses face one another and in which the contact between the rollers and the circuit board instantaneously decrease, if the rollers have a fixed mounting, in order to accelerate or decelerate briefly the circuit board with respect to the circumferential speed of the rollers, so as to be able to introduce it between or remove it from between the tongs. For this purpose the roller pairs 55 can also be raised from one another or provide with a free-wheeling means.

Thus, an electroplating apparatus for circuit boards is provided, which has a conveying system 19 for passing the circuit boards on a horizontal passage path through the treatment chamber 13. They are contacted by tong-like grippers 32, which run upstream of the lading edge 63 of the circuit board and in said area engage from above and below thereon. The grippers 32 are fixed to transverse beams 29, which are guided on either side by chains 26 and electrically contacted by contact rails 39. Therefore the circuit boards 12 are moved in a horizontal, central path and simultaneously contacted.

Figure 4:
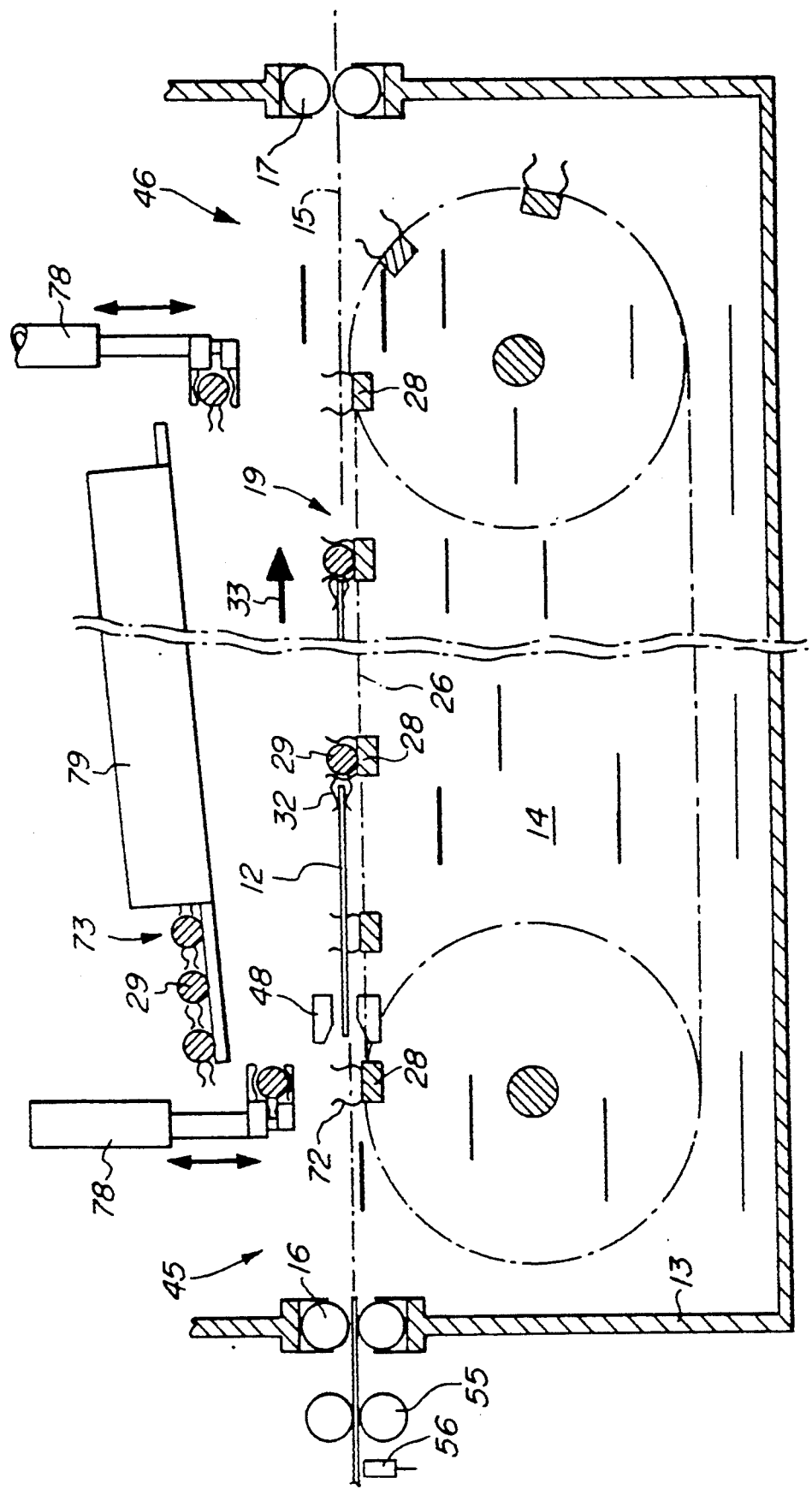

FIG. 4 diagrammatically shows a variant, in which for an otherwise identical construction and function to that described hereinbefore, the supports 29 are not constantly fixed to the support members 28 of the chain 26, but are instead fittable by means of an automatically functioning holding device 72, e.g. a snap fastening means. The supports are also fitted to the support members 28 by means of a matching design of the support 29 and the holding device 72 and this takes place in a given position, namely with contacting means 32 directed away from the passage direction 33. Unlike in the construction according to FIGS. 1 to 3, the support members 28 are fitted to the chain at a limited distance from one another.

In the represented embodiment above the passage path 15 is provided a return and storage device 73 for the supports 29 with the contacting means 32, e.g. in the form of a sloping chute, on which the supports are returned from the outlet area 46 to the inlet area 45. A gripping device 78 is provided in the inlet and outlet area and conveys backwards and forwards a support between the return and storage deice 73 and two associated support members on the conveyor (one to the right and one to the left). Thus, if necessary, a support 29 in the inlet area 45 is inserted in a support member pair 28, fixed there by the holding device and removed again in the outlet area, being returned on the return and storage device. In the vicinity of the return and storage device it is possible to separately provide a decopperizing device 79. However, it is also possible to provide the return in the vicinity of the lower strand of the chain and to carry out decopperizing there. This apparatus operates as follows. As described hereinbefore, the circuit boards are introduced through the insertion lock 16. The sensor 56 gives the signal for the gripping device 78 to insert a support 29 with contacting means 32 in the holding devices 72 of the support members 28 of the chain directly adjacent to the intake lock. The further process sequence is as described relative to FIGS. 1 to 3. The sensor 56 or a separate sensor can also detect the trailing edge of the circuit board and determine its length therefrom. As a function of this signal the control takes place. If the circuit board is shorter than the distance between two successive support members 28, less the construction length of the contacting means, then the next circuit board is fed in in such a way that its associated support is already inserted in the next support member pair. However, if the circuit board is longer, there is a jump over one or possibly more support members. This leads to a flexible and also complete occupancy of the apparatus even when there is a succession of different circuit boards.

In the end region of the apparatus, after the contacting means have been opened by the opening means 48 and the circuit board has been drawn out of the same, the support 29 is griped by the gripping device 78 and, accompanied by the opening of the holding means, e.g. by snapping out from the support members, is drawn upwards and placed on the return and storage device. From there it can e.g. be returned by gravity or other conveying means to the inlet area. It is also possible for the gripping device 78 to control the opening and closing of the tong-like contacting means. In this case there would be no need for the separate opening means 48 at the inlet and outlet.

If there is a treatment in several successive baths, then in the outlet area 46 the support 29 together with the circuit board can be introduced into the following apparatus. This can either take place by correspondingly constructed locks 16, 17 or in that the gripping device 78 grips the support together with the circuit board and transfers it into the next treatment chamber over and beyond the walls thereof. However, it is then necessary to ensure a corresponding supporting of the circuit boards.

The return of the supports then takes place over and beyond the successive treatment chambers. The return and storage device forms an intermediate or buffer store for the supports, whereof the maximum number is provided. In the case of a smaller occupancy due to longer circuit boards an accumulation is then formed on the return and storage device which compensates these differences.

In the embodiment according to FIGS. 5 to 8 the same features are given the same reference numerals as in the preceding drawings and a further description will not be provided.

The conveying means 19 are two continuous conveyors 20a, b, which are arranged above and below the passage path 15. It is possible to see the chain conveyors, to whose chain members are fitted spaced supports 29 (cf. FIGS. 6 to 8). In the supports are mounted rotary spindles 80 of the contact rolls 81 forming the contacting means 32. At their free ends, i.e. on the side of the support 29 remote from the treatment chamber 13 the contact rolls carry contact wheels 82, which roll on lower and upper contact rails 39a, b and are electrically contacted from there. At least one of the contact rails can be spring-mounted, which is represented by a spring suspension 90, e.g. of the top contact rail. It therefore exerts a contact pressure pressing the contact wheels 82 and/or contact rolls against one another. The contact wheels, in the present embodiment friction wheels, roll on the contact rails and normally also on one another, so that they drive the contact rolls 81 in synchronized opposition. If thicker circuit boards 12 enter the gap 89 between the contact rolls 81, the contact wheels 82 are raised from one another, which is made possible by the spring suspension 91. However, synchronization is ensured by the rolling of the contact wheels 82 on the contact rails 39a, b. However, it is also possible to permit the adaptation of the gap thickness by flexibility of other components, e.g. the contact wheels or rolls or their spindles.

The contact rolls can also be constructed as racks and then the contact wheels 82 are constructed as wheels meshing in one another and in the rack. They could retain their engagement at least during the passage of thinner circuit boards. Particularly in this construction it would also be possible to work with only one contact rail and then the transfer of power would take place by means of the gears to the contact roll remote from the contact rail. It is always ensured that working of varyingly thick circuit boards is possible, i.e. a modification to the width of the gap 89 between the contact rolls 81 without losing the contact between the individual contact wheels or with the contact rails.

Figure 7:
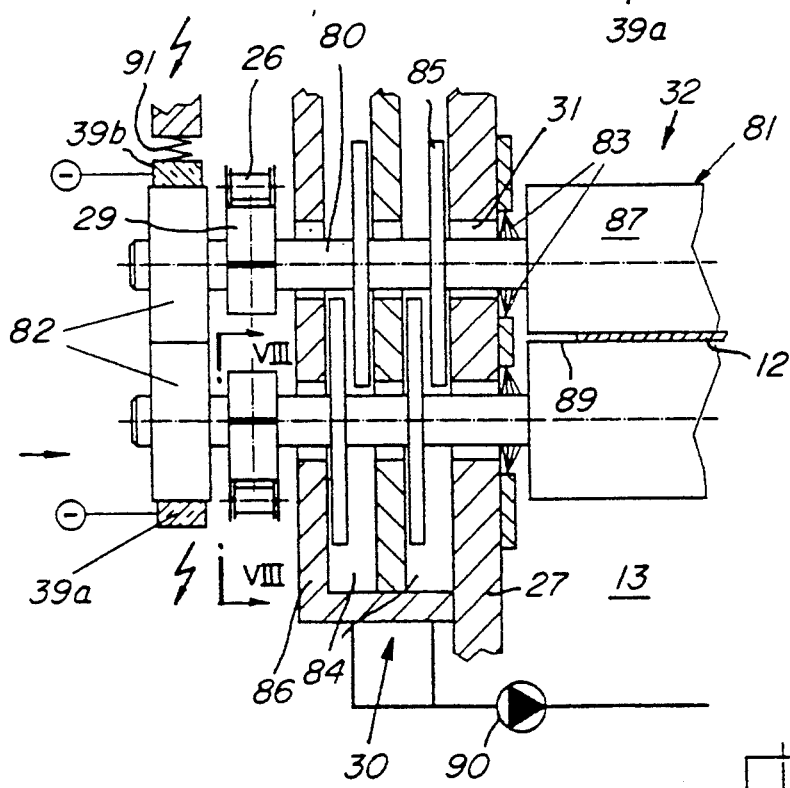
Figure 8:
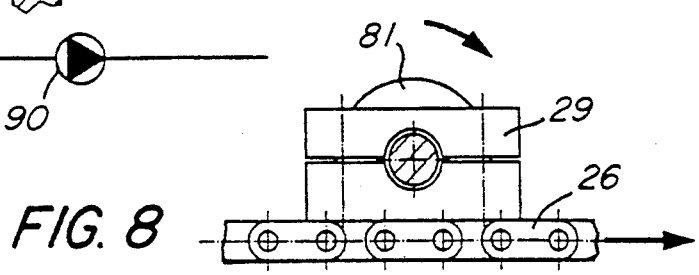

The spindles 80 pass through slots 31 in the chamber wall 27. A combined labyrinth-brush packing constitutes the packing 30 and contains brushes 83 or elastic strips on the inside of the chamber wall 27 and a two or multichamber labyrinth system 84, which has in each case for adjacent spindles 80 oppositely displaced disks 85, which cover the slots in the chamber and intermediate chamber walls 27, 86 and also have a corresponding connection to the preceding and following shaft pair. It is also in this way possible to seal the relatively long and large slits without any significant liquid overflow and the chain and contact wheels travel in the almost dry area. The treatment medium passing through the labyrinth system 84 is retuned to the treatment chamber or a tank, as indicated with the return system 90 (FIG. 7).

In the longitudinal direction the contact rolls 81 have alternating conductive portions 87 and insulating, e.g. plastic portions 88. By corresponding diameter differences between theses portions and/or the choice of a corresponding plastic material it is ensured that there is a good, flat contacting of the circuit boards passing through the gap 89 between the two contact rolls from both sides and the electroplating in the non-contacted areas is not impeded.

Figure 5:
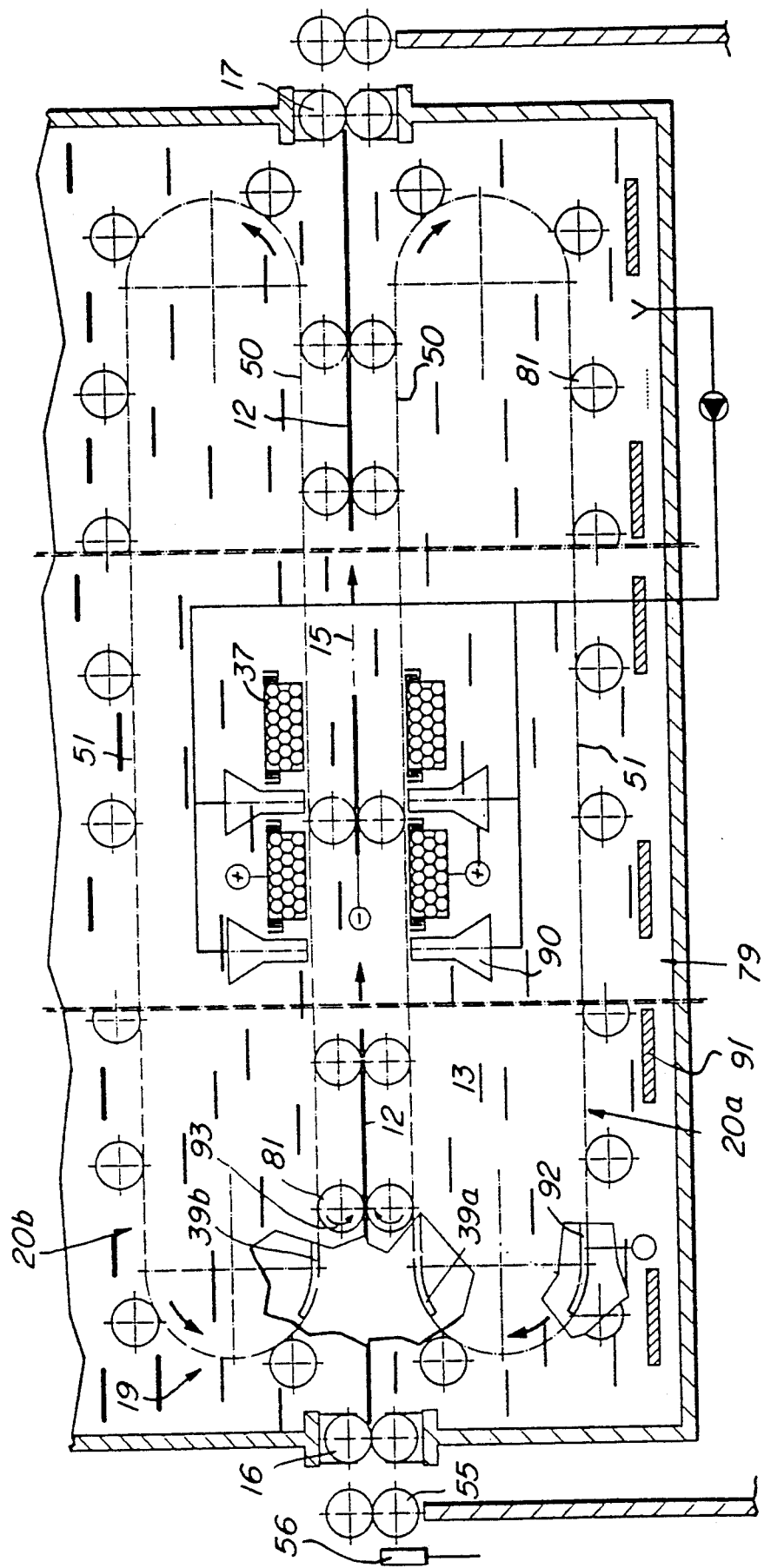

As shown in FIG. 5, the two continuous conveyors run parallel to one another and are driven in opposition. The spacing between adjacent supports 29 on the same chain 26 can be relatively small, being between 1.5 and 5 times and preferably between 2 and 3 times the contact roll diameter. This ensures an excellent contacting and good guidance.

In the vicinity of the anodes 37 there are wave nozzles 90, which deflect a flow of the treatment medium 14 onto the circuit boards 12 and therefore permit a good flow-through, including of the bores, etc.

In the lower part of the treatment chamber 13 there is a decopperizing section 79, which operates with additional auxiliary cathodes 91. Thus, in the vicinity of the return strand 51, which is the lower strand for the lower conveyor, there is a contact rail 92, which is anodically connected. As a result the contact rolls are rotated during decopperizing and are consequently uniformly freed from the undesired coating.

However, it is also possible to provide a correspondingly constructed decopperizing apparatus 79 in the vicinity of the return strand 51 of the upper conveyor 20b. It is also possible to provide other decopperizing apparatuses for the contact faces 87 of the contact rolls 81, e.g. by etch removal in a separate bath.

Figure 6:
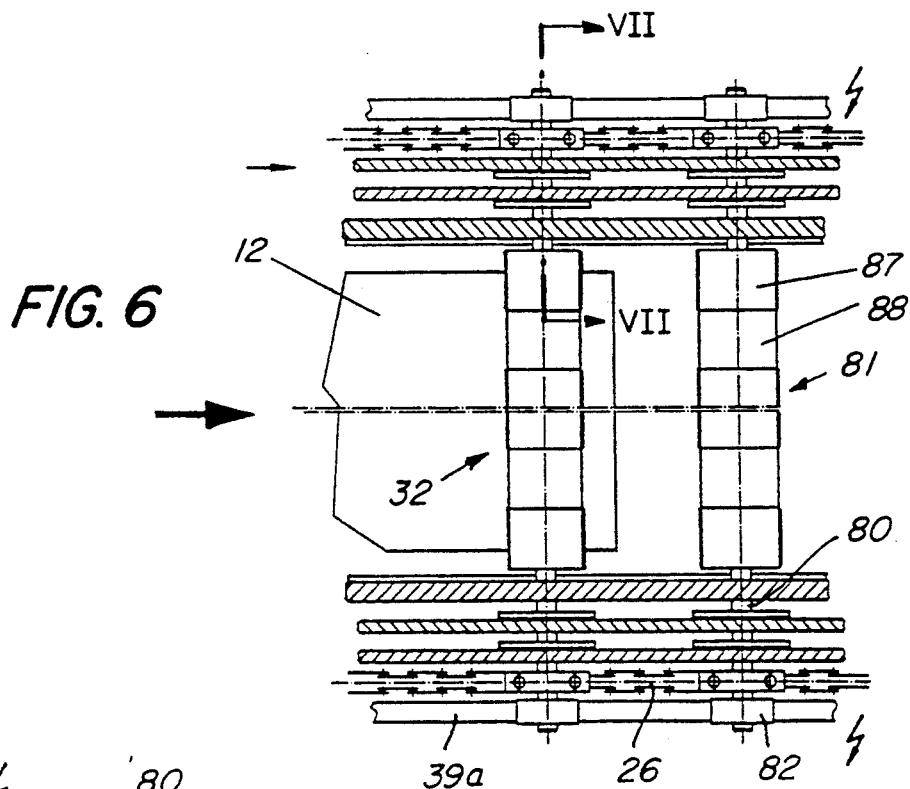

FIG. 6 shows a circuit board 12, which takes up virtually the entire treatment area width. If working takes place permanently with a smaller width, it is possible to reduce the working width by introduced means, so as to reduce the copper application to the non-active contact faces 87. However, it is also possible to convey circuit boards of different size through the apparatus without any changes being made. It is also possible to treat in juxtaposed manner narrower circuit boards.

The apparatus according to FIGS. 5 to 8 functions as follows. Following the supply of the circuit boards by the roll pairs 55 and the introduction lock 16, they are engaged by one of the numerous contact roll pairs 81 and conveyed into the gap 89 located between them, because the contact rolls 81 rotate in such a way (arrow 93), that they give the circuit board an additional speed, which is of the same level in the represented embodiment as the speed with which the actual contact roll pairs move. Thus, the circuit boards pass through the apparatus with twice the speed of the continuous conveyor, which reduces wear and mechanical costs. In addition, the circuit boards are contacted from above and below at constantly varying points, which ensures that during the passage the circuit boards are uniformly and frequently contacted at all points. Thus, the conveying system gives the article two drive components, whereof one, the advance speed component corresponds to the conveyor speed and the other, the additional speed component is additionally imparted to the articles due to the rotation of the contact rolls. If the contact wheels 82 have different diameters from the contact rolls and they can e.g. obtain their synchronization by means of intermediate wheels, the additional speed component given by the contact rolls to the articles 12, can be larger or smaller than the advance speed component of the contact rolls through the treatment chamber. However, it is always ensured that in the vicinity of the cathodic deposition no machine parts are installed in fixed manner with respect to the circuit board and could therefore lead to local shielding effects. Thus, there are no points on the circuit board which are not affected by the treatment.

The roll pairs which cooperate with one another in the vicinity of the cooperating working strands 50 of the conveyors 20, b, separate at the end of the passage path shortly before the discharge lock 17 and the individual contact rolls travel upwards and downwards into the decopperizing sections 79. Following their passage, they join together again in the vicinity of the introduction lock 16 and form a then cathodically connected contact roll pair.

I claim:

1. An apparatus for galvanic treatment of articles on a substantially horizontal passage path through a treatment chamber comprising conveying means for conveying the articles through a treatment medium in a conveying direction, and contacting means for supplying electrical power to the articles, the contacting means being provided to contact the articles at least in the vicinity of a central area of the passage path.

2. An apparatus according to claim 1, wherein the contacting means move in the conveying direction upstream of a leading edge of the articles in a passage direction of the passage path and engage said articles in the vicinity of the leading edge thereof in the conveying direction.

3. An apparatus according to claim 2, wherein the contacting means are constructed for gripping over the leading edge of the articles in the passage direction.

4. An apparatus according to claim 1, wherein the articles are guided substantially centrally to the passage path and are spaced from two lateral walls of the treatment chamber.

5. An apparatus according to claim 1, wherein the contacting means are grippers, which are located on supports of a continuous conveyor passing transversely through the treatment chamber and guided in a revolving manner therein.

6. An apparatus according to claim 5, wherein the supports of the continuous conveyor are rods, which engage in recesses of a roll or roller pairs of guide means driven synchronously with the continuous conveyor.

7. An apparatus according to claim 5, wherein the grippers have an opening mechanism, which can be operated on passing through opening means, the grippers having a tong-like construction loaded resiliently in the closing direction and being provided with operating arms, which are operated for the opening of the gripping arms by opening means constructed as sloping guides and particularly provided at the inlet and outlet area of the treatment chamber.

8. An apparatus according to claim 1, wherein the conveying means contain guide means, which act in the plane of the passage path.

9. An apparatus according to claim 8, wherein the guide means are roller means.

10. An apparatus according to claim 1, wherein the electrical power is supplied via the supports, which cooperate in the lateral area of the treatment chamber with power supply means.

11. An apparatus according to claim 10, wherein the power supply means comprise a contact rail.

12. An apparatus according to claim 1, wherein the conveying means having chains running on either side of the passage path and which guide between them supports in the form of rods.

13. An apparatus according to claim 1, wherein in the vicinity of the conveying means on the return path of at least one continuous conveyor, means are provided for electrolytic removal of coatings.

14. An apparatus according to claim 13, wherein the means for removing coatings is positioned along return sections of two conveyors.

15. An apparatus according to claim 1, wherein an upper strand of the conveying means determining the passage path and a return lower strand are located in the treatment chamber, the lower strand having a device for the electrolytic removal of coatings, which during passage on the passage path are applied to parts of the conveying means.

16. An apparatus according to claim 1, wherein an inlet and outlet of the treatment chamber are formed by roller locks.

17. An apparatus according to claim 1, wherein the conveying means are controllable as a function of the articles supplied to the inlet by at least one sensor responding to the articles in such a way that the contacting means are slowed down or stopped compared with the entrance speed of the articles at least until an article has reached the contacting means.

18. An apparatus according to claim 1, wherein the articles are slowed down or stopped prior to exiting from the treatment chamber with respect to the contacting means until a particular article has been removed from the contacting means.

19. An apparatus according to claim 1, wherein supply means are provided, which supply the articles to the contacting means at a higher speed than said contacting means and which introduce the articles into the contacting means before the latter close.

20. An apparatus according to claim 1, wherein removal means are provided which slow down the articles with respect to the contacting means in an exit area and pass the articles horizontally out of the opened contacting means.

21. An apparatus according to claim 1, wherein the contacting means and a support to which they are fitted are releasable from the conveying means for return conveying.

22. An apparatus according to claim 21, wherein the supports are fittable and rereleasable from the conveying means in varying spacings.

23. An apparatus according to claim 21, wherein gripping devices are provided at an inlet and outlet of the apparatus for fitting and releasing the support with respect to the conveying means and an interposed return and storage device for the supports.

24. An apparatus according to claim 1, wherein the contacting means are moved with a first speed through the treatment chamber and advancing means are provided for conveying the articles at a second speed higher than said first speed.

25. An apparatus according to claim 24, the contacting means comprising contact rolls, which are movable by the conveying means along the passage path.

26. An apparatus according to claim 25, wherein the contact rolls engage over the central area of the articles.

27. An apparatus according to claim 25, wherein above and below the passage path at least one contact roll of a set of cooperating contact rolls is provided, and the contact rolls of a set are driven and synchronized for rotary motion in opposite directions to one another.

28. An apparatus according to claim 25, wherein the conveying means contain upper and lower conveyors, by which the contact rolls are movable.

29. An apparatus according to claim 25, wherein the contact rolls are electrically contacted by contact wheels running on at least one contact rail.

30. An apparatus according to claim 29, wherein said contact rolls contact only one contact rail, two of said contact wheels being electrically conductively connected.

31. An apparatus according to claim 29, wherein the contact rail also mechanically synchronize the contact wheels with one another, at least one of said contact rails being provided with a spring suspension.

32. An apparatus according to claim 25, wherein the contact rolls contain in alternating manner conductive and insulating areas constructed as revolving circumferential areas.

33. An apparatus according to claim 32, wherein the insulating areas have a somewhat smaller diameter than the conductive areas.

34. An apparatus according to claim 24, further comprising contact rolls, which are rotated with a circumferential speed substantially equal to said first speed.

35. An apparatus according to claim 1, wherein the conveying means are two parallel and synchronously driven chain or belt conveyors on which the contacting means are mounted in a rotary manner in supports.

36. An apparatus according to claim 1, wherein the contacting means solely provide guidance of the articles through the treatment chamber.

37. An apparatus according to claim 1, wherein the articles treated by the apparatus are printed circuit boards.

38. An apparatus according to claim 1, wherein the contacting means move in a central area of the passage path.

39. An apparatus according to claim 1, wherein the treatment medium is an electrolytic solution.

* * * * *